United States Patent
Michalk et al.

(10) Patent No.: US 7,915,739 B2
(45) Date of Patent: Mar. 29, 2011

(54) METHOD AND ARRANGEMENT FOR CONTACT-CONNECTING SEMICONDUCTOR CHIPS ON A METALLIC SUBSTRATE

(75) Inventors: Manfred Michalk, Erfurt (DE); Sabine Nieland, Gotha (DE); Martin Michalk, Leipzig (DE)

(73) Assignee: Assa Abloy AB, Stockholm (SE)

( * ) Notice: Subject to any disclaimer, the term of this patent is extended or adjusted under 35 U.S.C. 154(b) by 58 days.

(21) Appl. No.: 11/816,375

(22) PCT Filed: Feb. 17, 2006

(86) PCT No.: PCT/IB2006/050524
§ 371 (c)(1),
(2), (4) Date: Aug. 7, 2008

(87) PCT Pub. No.: WO2006/087686
PCT Pub. Date: Aug. 24, 2006

(65) Prior Publication Data
US 2009/0085226 A1      Apr. 2, 2009

(30) Foreign Application Priority Data
Feb. 19, 2005   (DE) .................. 10 2005 007 643

(51) Int. Cl.
*H01L 23/48* (2006.01)
(52) U.S. Cl. .. 257/778; 257/678; 257/790; 257/E23.169
(58) Field of Classification Search .................. 257/778, 257/787, 667, 704, 790, E23.169
See application file for complete search history.

(56) References Cited

U.S. PATENT DOCUMENTS
5,336,931 A * 8/1994 Juskey et al. ................. 257/787
7,179,683 B2 * 2/2007 Low et al. ..................... 438/108
2003/0052419 A1   3/2003 Ujiie et al.

FOREIGN PATENT DOCUMENTS
DE      4337921         5/1995
JP      0818236         7/1996
JP      2004135192      4/2004

OTHER PUBLICATIONS

International Search Report prepared by the European Patent Office dated Oct. 23, 2006; International Application No. PCT/IB2006/050524; Applicant, ASSA Abloy Identification Technology Group AB.
Written Opinion of the International Searching Authority prepared by the European Patent Office dated Oct. 23, 2006; International Application No. PCT/IB2006/050524; Applicant, ASSA Abloy Identification Technology Group AB.

* cited by examiner

*Primary Examiner* — Thinh T Nguyen
(74) *Attorney, Agent, or Firm* — Sheridan Ross P.C.

(57) ABSTRACT

The method comprises the following steps: the substrate in the form of a one-piece basic substrate (4) is prepatterned into regions corresponding to future modules, pads of the semiconductor chip (1) are then contact-connected in predetermined regions of a first area of the basic substrate (4) and on the top side (12) of the prepatterned basic substrate (4) and on one area side of the semiconductor chip (1) a first adhesive layer (16) is applied, a second adhesive layer (17) is subsequently applied to the other area side of the semiconductor chip (1), and a curing of the adhesive layers (16, 17) and a final patterning of the metallic basic substrate (4) are then effected.

14 Claims, 4 Drawing Sheets

Figure 1:
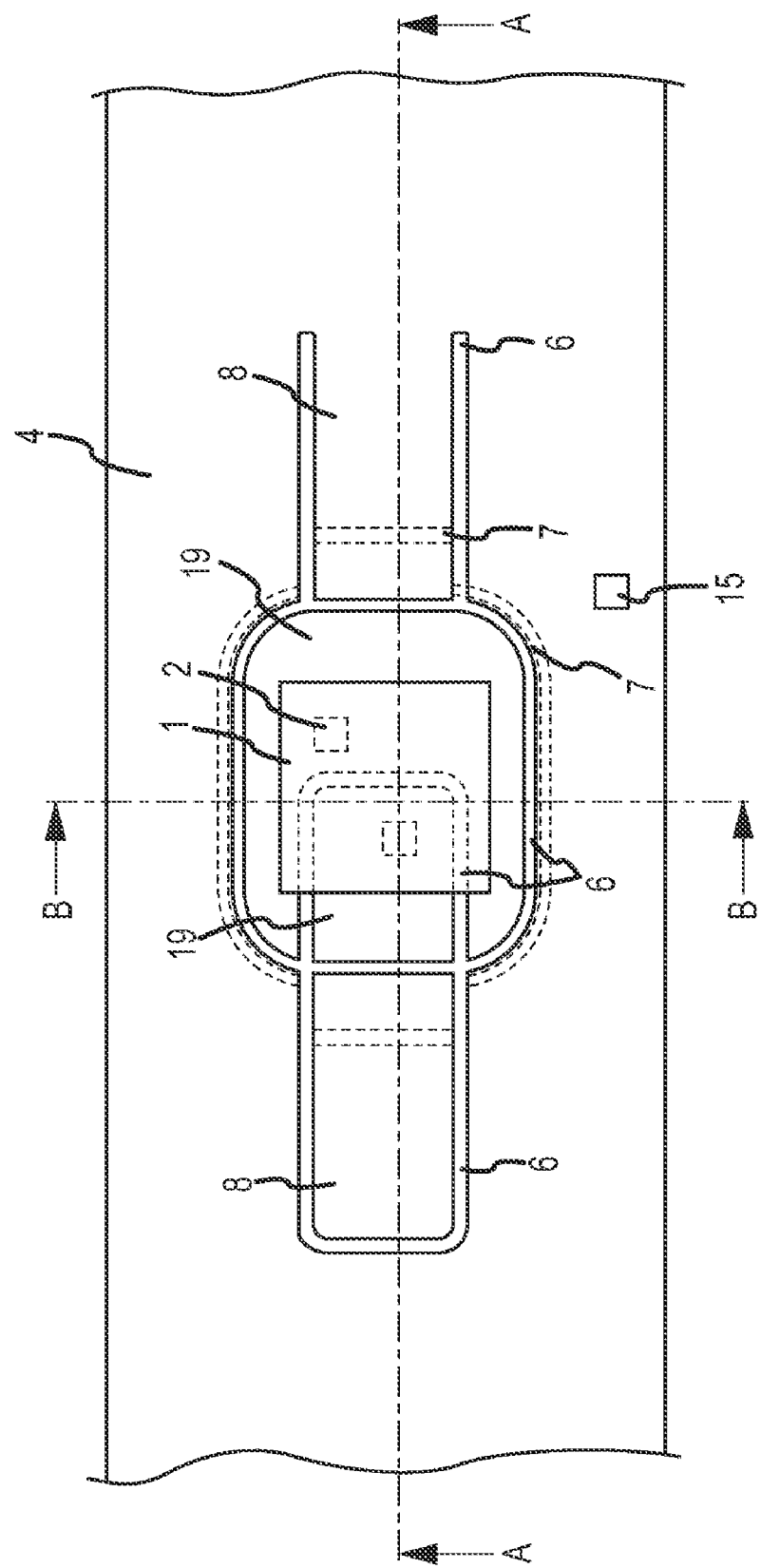

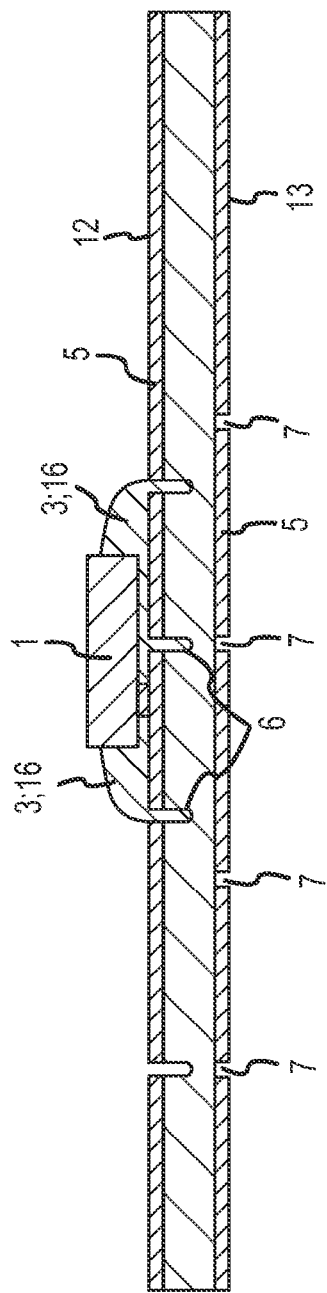
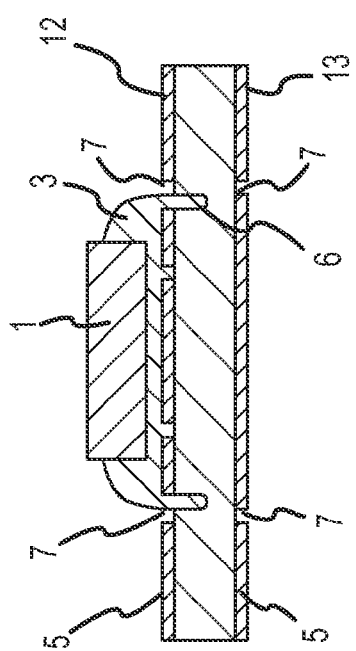

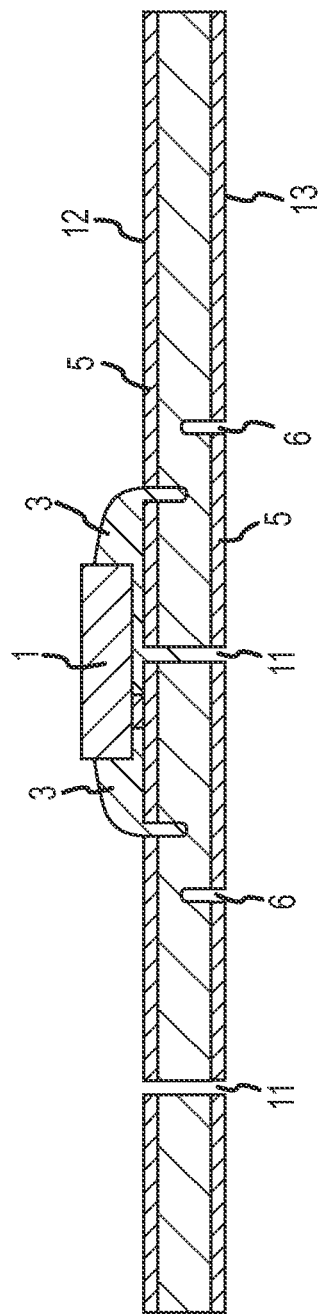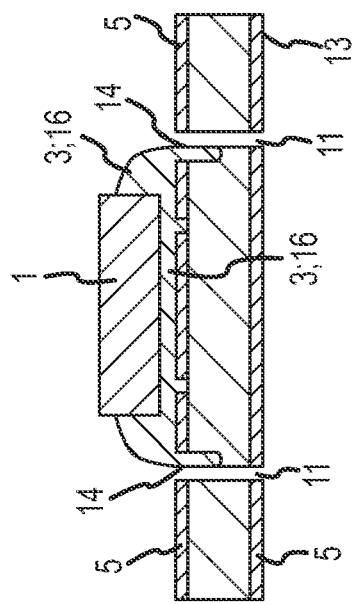

METHOD AND ARRANGEMENT FOR CONTACT-CONNECTING SEMICONDUCTOR CHIPS ON A METALLIC SUBSTRATE

CROSS-REFERENCE TO RELATED APPLICATIONS

This application is a 371(c) National Stage of PCT/IB2006/050524 filed Feb. 17, 2006, which claims priority to German patent application Serial No. DE102005007643.2 filed Feb. 19, 2005, the disclosures of each of which are hereby incorporated by reference in their entireties.

The invention relates to a method for contact-connecting semiconductor chips on a metallic substrate on which a resist is situated at least on one side, and to a substrate and a module for receiving semiconductor chips.

The invention is suitable in particular for producing modules with very thin semiconductor chips which are intended to have a high service life. Modules of this type are required for example for identity cards having large cryptographic chips.

In the prior art, for producing modules of this type it is known to bond a semiconductor chip (rear side), that is to say the non-active side, onto a substrate, this usually being effected by adhesive bonding or soldering. The substrate furthermore carries metallic conductor tracks. From the active side of the chip with its metal contact areas (pads) microwires are drawn from a respective pad to a respective conductor track. Semiconductor chips, microwires and conductor tracks, depending on the concrete embodiment of the module, are subsequently protected by application of thermosetting plastic or thermoplastic moulding or encapsulation compositions. The substrates comprise special plastics, e.g. printed circuit boards, ceramic or specially configured metal strips (leadframes). Modules using this technology are used primarily in telephone cards and memory cards. Methods of this type are described in Yahya Haghiri, Thomas Tarantino: Vom Plastik zu Chipkarte [From plastic to smart card], Carl Hanser Verlag Munich Vienna, 1999.

What is disadvantageous about modules closed off with thermosetting plastics or thermoplastics is their large thickness and the asymmetrical construction of the layers. This leads, especially in the case of large-area chips, to increased mechanical loading in the event of bending stress. Moreover, module thicknesses of <300 µm cannot be produced or can only be produced with a high outlay.

Thinner modules can be produced by means of flip-chip technology, but the known solutions are usually constructed in greatly layer-asymmetrical fashion, the impact-sensitive semiconductor area, the non-active chip side, remaining unprotected.

DE 43 37 921 A1 discloses a contactless smart card in which a semiconductor chip is arranged in layer-symmetrical fashion in a chip housing. What is disadvantageous in this case, however, is the rectangular, sharp-edged embodiment, which can cause stress cracks upon encapsulation into further circuit carriers (e.g. smart cards), and also the unsatisfactory embodiment of the external contacts of the module, which is only inadequately suitable for automated contact-connection, e.g. for the connection of smart card antenna coils.

The invention is based on the object of specifying a method and a module of the type mentioned in the introduction which enable an optimum protection against impact, bending loading, moisture and against the influence of light in conjunction with a minimum thickness of the module for high-quality semiconductor chips with an area of up to (5×5) mm$^2$.

The object is achieved according to the invention by means of a method having the features specified in Claim 1, and by means of a substrate having the features specified in Claim 12, and also by means of a module having the features specified in Claim 1.

Advantageous refinements are specified in the associated subclaims.

By means of the method according to the invention, the semiconductor chip is fixed on one area side by means of a first adhesive layer on a first area, the top side of a metallic, prepatterned, one-piece basic substrate, and in the procedure the chip pads are contact-connected in predetermined regions of the first area of the basic substrate and a second adhesive layer is then applied to the other area side of the semiconductor chip, onto which the underside of a metallic one-piece cover substrate is placed, and in which, after the curing of the adhesive layers, the final patterning of the metallic basic substrate is effected, so that the semiconductor chip is preferably embedded in layer-symmetrical fashion between first and second adhesive layers and metallic basic substrate and cover substrate.

The basic substrate is prepatterned by introducing etching trenches and, if appropriate, structure lines on the top side of the basic substrate for the definition of external connections (pins) and internal connections and also the edge of the future module.

Preferably, the etching trenches for the definition of the module edge are configured in such a way that, with minimization of the module area, the future semiconductor chip to be applied is completely enclosed by the module edge and the module edge has radii of greater than 0.3 mm.

This method provides a module body which is constructed in layer-symmetrical fashion and in flexurally elastic fashion, and in which the semiconductor chip is arranged in light-tight fashion and in a manner protected against moisture.

The etching trenches introduced into the substrate define the edge of the module, stop the adhesive flow of the first and second adhesive layers, so that adhesive does not pass onto adjacent areas, and simplify the final patterning of the basic substrate or the module.

Mechanical stress concentrations in the event of embedding and bending of the module in future use can be prevented by rounded portions of the module areas and bevels.

The substrates are provided with metallic resist layers on all sides, preferably made of tin or silver, which, on the one hand, are used as resist layers for the subsequent final patterning processes that are to be accomplished by means of etching technology, and, on the other hand, serve as contact-connecting metals for the internal chip contact-connection and the external contact-connection to the further circuit. The metallic resist layers are visually inconspicuous due to their metallically matt, whitish surface and are largely moisture-stable.

The basic substrate is prepatterned by introducing resist-free structure lines in addition to the arrangement of etching trenches. The term resist-free structure lines denotes structure elements having no resist on the basic material. The structure lines are usually embodied with a width of 10 µm to 50 µm and a depth corresponding at least to the resist thickness.

The structure lines are provided as follows:
 on the top side and on the underside of the basic substrate in the region of the internal and external connections,
 on the underside of the basic substrate directly beneath the etching trenches which define the connections,
 in the region of the external connections in the vicinity of the module edge transversely with respect to the direction of the connections on the underside or top side of the basic substrate, and
    on the top side and underside of the basic substrate along or at a small distance from the outer edge of the module edge.

The prepatterning of the basic substrate by means of etching trenches and resist-free structure lines enables very simple final patterning of the basic substrate to form modules. It is possible in this case to produce basic substrates prepared in this way separately from the final patterning by means of etching technology and the contact-connection.

The contact-connection of the semiconductor chips on the substrate is preferably effected by means of flip-chip bonding by a procedure in which gold-plated chip contact bumps are contact-connected onto the tin or silver layers of the substrate by means of soldering or welding and then a first adhesive layer is introduced between the active semiconductor layer side and the top side of the basic substrate. Afterwards, a second adhesive layer is applied and a cover substrate is emplaced.

The basic substrate and cover substrate expediently comprise the same material and have the same thickness. Metals having a low coefficient of thermal expansion, for example FeNi, FeNiCo and similar alloys, are particularly suitable in this case.

The soldered or welded flip-chip contacts have a high strength, are thermally insensitive and moisture-stable. The adhesive can be introduced after the contact-connection and can cure at a high temperature without pressure members having to be placed onto the semiconductor chip.

The thermal expansion behaviour is well adapted to the chip material silicon.

The alloys specified are mechanically stiff, exhibit flexural strength and are non-rusting. The cover substrate may be refined with other metals, such as gold, palladium, etc.

It is furthermore possible for the cover edge to be bevelled towards the top side in order to reduce mechanical stresses. This may furthermore be achieved by arranging the resist-free structure lines at the top side of the basic substrate in a manner slightly offset relative to those at the underside of the basic substrate, so that the module edge of the basic substrate is bevelled towards its underside after the etching-through process.

A further advantageous embodiment arises from the fact that the cover substrate is drawn or bent downwards at least one location of its edge, so that this location is placed onto the basic substrate and there is an electrically conductive connection after the curing of the adhesive layers.

This produces not only an improvement in the mechanical properties but also an increased protection of the semiconductor chip against electromagnetic waves.

The module according to the invention has a sandwich-like construction and can be produced with select materials. The thin chip lies in the central layer between metal areas which are largely non-divided on both sides and completely enclose the chip.

Said metal areas are intended to be only slightly larger than the chip. The module body can be rounded or bevelled at all points, so that no sharp edges or corners occur.

Since the module is visible in some applications, such as in passports, for example, it should be visually as inconspicuous as possible, which is achieved well by virtue of the metallically light embodiment. In this case, it is also distinguished by the chip being afforded virtually complete protection against light.

The invention is explained in more detail below on the basis of an exemplary embodiment.

Figure 4:
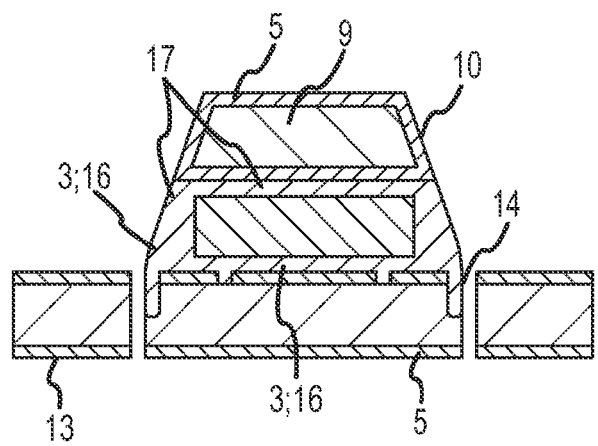

In the associated drawing:

FIG. 1 shows a plan view of a prepatterned basic substrate with a contact-connected chip, FIG. 2a shows a cross section through the arrangement illustrated in FIG. 1 parallel to the connections after the adhesive application and curing, FIG. 2b shows a cross section through the arrangement illustrated in FIG. 1 after the adhesive application and curing transversely with respect to the connections, FIG. 3a shows a cross section through the contact-connected and adhesively bonded arrangement according to FIG. 1 longitudinally with respect to the connections after the final patterning, FIG. 3b shows a cross section through the contact-connected and adhesively bonded arrangement according to FIG. 1 transversely with respect to the connections after the final patterning, and FIG. 4 shows a cross section through an arrangement with a cover substrate transversely with respect to the connections after the final patterning.

FIG. 1 shows a section of a strip-type metallic basic substrate 4. In the example, the basic substrate 4 has a thickness of 60 μm and comprises an iron-nickel alloy. It is prepatterned for receiving a semiconductor chip 1. The introduced index hole 15 facilitates the transport of the strip and the identification of the position of the strip. It is readily and advantageously possible to embody the basic substrate 4 in planar fashion or in wide strips and to arrange a multiplicity of semiconductor chips 1 next to one another and/or in rows on correspondingly patterned regions.

Etching trenches 6 are introduced into the top side 12 of the basic substrate 4. In the example, the etching trench width is 100 μm and the depth is 30 μm to 40 μm. The semiconductor chip 1 having a size of 5×5 mm$^2$ is surrounded by an etching trench 6 which encloses the corners of the semiconductor chips 1 at a distance of approximately 0.3 μm and with radii of approximately 1 mm. The etching trench 6 serves for limiting the adhesive flow during and after the fixing of the semiconductor chip 1 on the top side 12 of the basic substrate 4. In the example, the semiconductor chip 1 has two contact-connecting areas with contact bumps 2. Each contact bump 2 is contact-connected on a future internal connection 19. In the example illustrated, the left-hand internal connection 19 lies at an external connection 8 which is defined by etching trenches 6 or structure lines 7 in the still one-piece basic substrate 4.

The internal connections 19 are defined by etching trenches 6. Resist-free structure lines 7 are arranged on the underside 13 of the basic substrate 4 beneath the etching trenches 6 which define the internal connections 19. This ensures that the internal connections 19 are completely separated from one another during the final patterning of the substrate 4 by means of etching technology.

The second internal connection 19 takes up virtually the entire module area within the etching trench 6 including the semiconductor chip 1. Transversely with respect to the direction of the external connections 8, resist-free structure lines 7 having a width of 50 μm are arranged on the underside 13 of the basic substrate 4, in the example approximately 0.7 mm from the etching trench 6 which encloses the semiconductor chip 1. During the final patterning, that is to say during the production by means of etching technology of the multi-piece structure of the basic substrate 4, the resist-free structure lines 7 change into etching trenches 6 which partially reduce the cross section of the external connections 8. Bending forces possibly acting on the external connection 8 thus cannot be transmitted to the internal connections 19 and to the semiconductor chip 1 and its contact bumps 2.

A further resist-free structure line 7 borders the etching trench 6 which encloses the semiconductor chip 1, with the exception of the regions of the transitions from the internal to the external connections 8 and 19. Beneath this resist-free structure line 7, a resist-free structure line 7 is likewise arranged on the underside 13 of the basic substrate 4. These structure lines 7 on the top side 12 and the underside 13 and also resist-free structure lines 7 which run beneath the internal connections 8 and 19, and etching trenches 6 which, on the top side 12 of the basic substrate 4, and also resist-free structure lines 7 which, on the underside 13 and top side 12 of the basic substrate 4, define the edge of the external connections 8, enable the final module structure to be produced in a simple manner by means of etching technology. The one-piece metallic structure of the basic substrate 4 is separated into the individual connections 8 and 19 and the entire module is virtually completely separated from the strip-type carrier metal.

In the example illustrated, an external connection 8 still remains connected to the strip-type carrier metal in order to facilitate transport operations during module production.

It is readily possible to produce modules with more than two connections 8, 19. Furthermore, an internal connection 19 need not cover almost the entire semiconductor chip 1, as illustrated in the example, rather the internal connections 19 may be embodied in a similar manner and it is possible for regions of the basic substrate 4 to be configured, after the final patterning, without connection to the internal connections 19 but in a manner fixedly connected to the semiconductor chip 1 and protecting the latter. However, it is desirable to obtain the area of the basic substrate 4 under the semiconductor chip 1 such that an optimum/maximum flexural and impact strength of the module is afforded.

FIG. 2a shows a cross section through the longitudinal side of the arrangement in accordance with FIG. 1 after the application and curing of the first adhesive layer 16. The semiconductor chip 1 was contact-connected according to flip-chip technology in the example. The contact-connection was effected by soldering the contact bumps 2, which are composed of gold and the height of which is approximately 20 μm, onto the 1 μm to 2 μm thick resist layer 5 made of tin on the top side 12 of the basic substrate 4. The gap between chip 1 and basic substrate top side 12 is completely filled with the first adhesive layer 16, which likewise wets the chip side areas and fills the etching trenches 6 under and around the chip 1. On the underside 13 of the basic substrate 4, resist-free structure lines 7 having a width of approximately 50 μm are introduced in the metal resist 5, as already described for FIG. 1.

FIG. 2b shows a cross section perpendicular to the arrangement illustrated in FIG. 1. The arrangement of the opposite resist-free structure lines 7 which are situated on the underside 13 and top side 12 of the basic substrate 4 and which define the later module edge 14 is illustrated here. The resist-free structure lines 7 on the basic substrate underside 13 may likewise be moved in in the direction of the module centre in order to have the effect that the module edge 14 is bevelled somewhat after the final module patterning in order to reduce possible mechanical stresses with the module surroundings.

FIGS. 3a and 3b illustrate the cross sections indicated in FIGS. 2a and 2b after the final module structure has been produced by means of etching technology. The internal connections 19 are electrically isolated from one another by the through-etching 11, and the end of the left-hand external connection 8 is separated from the strip-type carrier metal of the formerly one-piece basic substrate 4. The external connections 8 have, on the underside 13, etching trenches 6 which reduce transmission of bending loads that possibly occur to the internal connections 19. The module is separated from the carrier metal and the module edge 14 is realized.

Modules of this type can advantageously be used without a protective covering for areas of use where there is only low mechanical loading on the module. The appearance of the module can be improved by printing or spraying specific colours on the module surface or the exposed chip side.

FIG. 4 shows a section through the module transversely with respect to the direction of the external connections 8 after the production of the final structure. The protection of the module is extended by a cover substrate 9 applied to a second adhesive layer 17 on the rear side of the semiconductor chip 1. The first and second adhesive layers 16 and 17 flow together at the chip edge, the underfiller 3 (first adhesive layer 16) and the second adhesive layer 17 completely enclosing the semiconductor chip 1 and connecting the cover substrate 9 to the basic substrate 4. The cover substrate 9 is provided with an edge bevel 10.

LIST OF REFERENCE SYMBOLS

1 Semiconductor chip
2 Contact bump
3 Underfiller; adhesive
4 Basic substrate
5 Metallic resist
6 Etching trench
7 Resist-free structure line
8 External connection; pin
9 Cover substrate
10 Edge bevel
11 Through-etching
12 Top side of basic substrate; first metallic area
13 Underside of basic substrate
14 Module edge
15 Index hole
16 First adhesive layer
17 Second adhesive layer
18 Underside of cover substrate
19 Internal connection

The invention claimed is:
1. A module in which a semiconductor chip is arranged on a substrate, and wherein:
   said substrate comprises a basic conductive substrate with a metallic resist provided on both sides of the substrate, wherein resist free etching trenches are provided on the surface of the basic substrate, wherein said etching trenches delimitate on the substrate an internal region and at least two separate external regions for external electrical connections and wherein the internal region is split in at least two internal electrical connection zones by at least one through-etching trench;
   said semiconductor chip comprises at least two contact bumps which are each bonded to at least said metallic resist of each of said internal connection zones, forming a gap between the chip and the surface of the metallic resist, and wherein said semiconductor chip is fully enclosed in said internal region;
   a first adhesive layer covers entirely the surface of said internal region, including below the chip, filling said gap and said etching trenches bordering said internal region; and
   a second adhesive layer is positioned over said semiconductor chip and said first adhesive layer.

2. The module according to claim 1 wherein the substrate is a one piece pre-patterned basic substrate and wherein the etching trenches border areas for future semiconductor chips to be placed.

3. The module according to claim 2, wherein the resist layers comprise at least one of tin and silver.

4. The module according to claim 2, wherein the etching trenches border the areas of future semiconductor chips at a distance of about 0.2 mm to about 0.4 mm.

5. The module according to claim 4, wherein the etching trenches are embodied with a width of about 20 μm to 150 μm and with radii of less than about 0.3 mm.

6. The module according to claim 2, wherein the etching trenches have a depth of about 30 to 70% of the basic substrate thickness.

7. The module according to claim 2, wherein resist-free structure lines having a width of about 10 μm to about 50 μm are arranged on an underside and/or the top side of the basic substrate.

8. The module according to claim 7, wherein the structure lines are arranged transversely with respect to the direction of the external electrical connections.

9. The module according to claim 8, wherein a further structure line borders the etching trench enclosing the future semiconductor chip with the exception of the regions of the transitions from the internal to the external electrical connections on the top side and on the underside of the basic substrate.

10. The module according to claim 2, wherein the resist-free structure lines are arranged on the top side and the underside of the basic substrate in such a way that a future module has an inwardly directed edge bevel at its underside.

11. The module according to claim 1, wherein a cover substrate is brought on the second adhesive layer on the rear side of the semiconductor chip.

12. The module according to claim 11, wherein the cover substrate is inwardly bevelled towards the top side and/or the basic substrate is inwardly bevelled towards the underside.

13. The module according to claim 11, wherein the cover substrate is drawn downwards at least one location of its edge, so that this location is seated on the basic substrate and is electrically connected thereto.

14. The module according to claim 1 wherein said first adhesive layer fills also at least partially said at least one through-etching trench.

\* \* \* \* \*